United States Patent
Katou et al.

(10) Patent No.: US 9,184,285 B2
(45) Date of Patent: Nov. 10, 2015

(54) SEMICONDUCTOR DEVICE WITH GATE ELECTRODES BURIED IN TRENCHES

(71) Applicant: RENESAS ELECTRONICS CORPORATION, Kawasaki-Shi (JP)

(72) Inventors: Hiroaki Katou, Kanagawa (JP); Hiroyoshi Kudou, Kanagawa (JP); Taro Moriya, Kanagawa (JP); Satoshi Uchiya, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 13/851,875

(22) Filed: Mar. 27, 2013

(65) Prior Publication Data

US 2013/0264637 A1    Oct. 10, 2013

(30) Foreign Application Priority Data

Apr. 9, 2012 (JP) ................. 2012-088373

(51) Int. Cl.

| H01L 29/66 | (2006.01) |
|---|---|
| H01L 29/78 | (2006.01) |
| H01L 29/08 | (2006.01) |
| H01L 21/8234 | (2006.01) |
| H01L 27/088 | (2006.01) |
| H01L 29/423 | (2006.01) |
| H01L 29/45 | (2006.01) |
| H01L 29/06 | (2006.01) |

(52) U.S. Cl.
CPC .... *H01L 29/7827* (2013.01); *H01L 21/823487* (2013.01); *H01L 27/088* (2013.01); *H01L 29/0865* (2013.01); *H01L 29/7811* (2013.10); *H01L 29/7813* (2013.01); *H01L 29/0615* (2013.01); *H01L 29/42368* (2013.01); *H01L 29/42372* (2013.01); *H01L 29/456* (2013.01)

(58) Field of Classification Search
CPC ............ H01L 29/1095; H01L 29/7813; H01L 29/7802; H01L 29/407; H01L 29/4238; H01L 29/66712; H01L 29/66734; H01L 29/7827
USPC ........................................ 257/328–342, 345
See application file for complete search history.

(56) References Cited

U.S. PATENT DOCUMENTS

| 6,198,127 B1 | 3/2001 | Kocon | |
|---|---|---|---|
| 6,433,385 B1 | 8/2002 | Kocon et al. | |
| 8,384,151 B2* | 2/2013 | Pfirsch | 257/328 |
| 2002/0187597 A1* | 12/2002 | Ninomiya | 438/197 |
| 2011/0068390 A1* | 3/2011 | Ogasawara | 257/330 |
| 2013/0001592 A1* | 1/2013 | Miyahara et al. | 257/77 |

FOREIGN PATENT DOCUMENTS

| JP | 2000-353805 A | 12/2000 |
|---|---|---|
| JP | 2004-513518 A | 4/2004 |

\* cited by examiner

*Primary Examiner* — Amar Movva
*Assistant Examiner* — Cory Eskridge
(74) *Attorney, Agent, or Firm* — McDermott Will & Emery LLP

(57) ABSTRACT

Trenches are formed in a base layer and extend parallel to each other. A gate insulating film is formed on the inner wall of each of multiple trenches. A gate electrode GE is buried in each of the trenches. The source layer is formed in the base layer to a depth less than the base layer. The source layer is disposed between each of the trenches. A second conduction type high concentration layer is formed between the source layer and the trench in a plan view. The trench, the source layer, and the second conduction type high concentration are arranged in this order repetitively in a plan view. One lateral side of the trench faces the source layer and the other lateral side of the trench faces the second conduction type high concentration layer.

5 Claims, 18 Drawing Sheets

COMPARATIVE ART

SEMICONDUCTOR DEVICE WITH GATE ELECTRODES BURIED IN TRENCHES

CROSS-REFERENCE TO RELATED SPECIFICATIONS

The disclosure of Japanese Patent Application No. 2012-088373 filed on Apr. 9, 2012 including the specification, drawings, and abstract is incorporated herein by reference in its entirety.

BACKGROUND

The present invention relates to a semiconductor device and, in particular, to a semiconductor device having a vertical transistor.

Some semiconductor devices have vertical transistors. The vertical transistor is used, for example, in a device for controlling a high current. Some vertical transistors have a trench gate structure. The transistor having the trench gate structure has a structure in which a p-layer as a channel layer is formed over an n-layer as a drain and, further, an n-layer as a source is formed to the surface layer of the p-layer as shown, for example, in Japanese Unexamined Patent Application Publication No. 2000-353805 and Japanese Unexamined Patent Application Publication (Translation of PCT Application) No. 2004-513518. The gate electrode of the trench structure extends from the p-layer to the n-layer. The lower end of the gate electrode enters in the n-layer.

Further, in Japanese Unexamined Patent Application Publication No. 2000-353805 and Japanese Unexamined Patent Application Publication (Translation of PCT Application) No. 2004-513518, the n-layer as the source is disposed only on one lateral side of the trench gate. The $p^-$ region is formed to a depth more than the p well on the other lateral side of the trench gate. The $p^-$ region is disposed so as to lower the resistance of the drain region and ensure the withstand voltage of the transistor.

SUMMARY

One of the indexes for the performance of the vertical transistors is that the on-resistance of the drain is low. In order to lower the drain resistance, the gates are preferably arranged densely, thereby increasing the channel density. On the other hand, the index for the performance of the vertical transistor also includes that safety operating area (SOA) is wide in the graph showing Vd-Id characteristics (refer to FIG. 19). SOA is an area where the semiconductor device can be used without causing thermal runaway. However, if the gates are arranged densely, SOA is narrowed. As described above, it was difficult to ensure SOA while lowering the drain resistance.

Other subjects and novel features of the invention will become apparent by reading the description of the present specification and with reference to the appended drawings.

According to an aspect of the invention, multiple trenches are formed in a semiconductor substrate. A gate insulating film is formed on the lateral side of the trench. A gate electrode is buried in the trench. A first conduction type source layer and a second conduction type high concentration layer are formed in a second conduction type base layer. The second conduction type high concentration layer has an impurity concentration higher than that of the base layer. The trench, the source layer, and the second conduction type high concentration layer are arranged in this order repetitively in a plan view, and one lateral side of the trench faces the source layer and the other lateral side of trench faces the second conduction type high concentration layer.

According to another aspect of the invention, two lateral sides of the trench described respectively face source layers different from each other. The source layer facing one lateral side is coupled to a source electrode and the source layer facing the other lateral side is not coupled to the source electrode.

According to the aspect of the invention, a wide SOA can be ensured while lowering the drain resistance.

DETAILED DESCRIPTION

Figure 1:
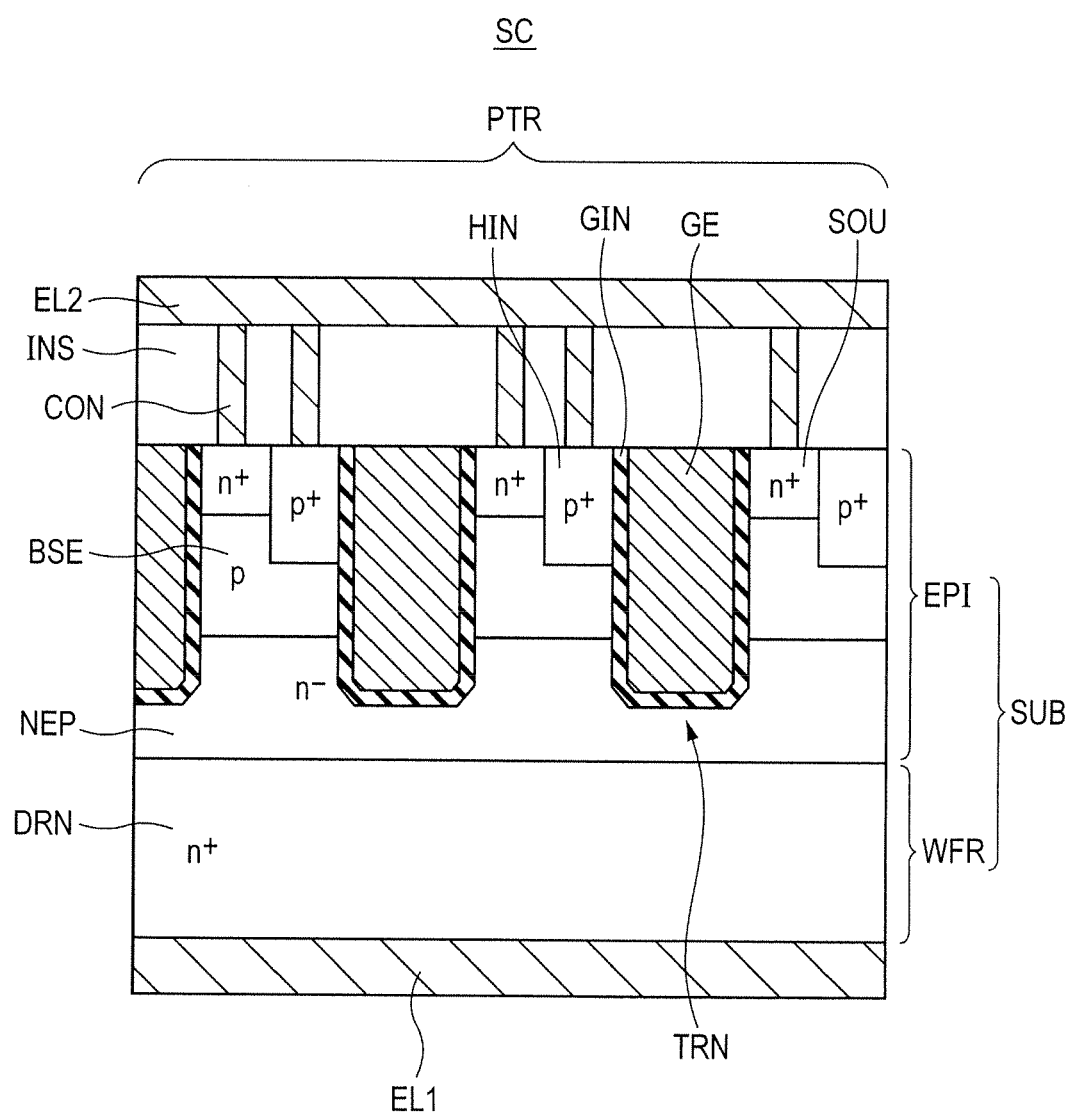
FIG. 1 is a cross sectional view showing a configuration of a semiconductor device according to a first embodiment.

Preferred embodiments of the invention are to be described with reference to the drawings. Throughout the drawings, identical constitutional elements carry same reference numerals for which explanations are optionally omitted.

First Embodiment

Figure 2:
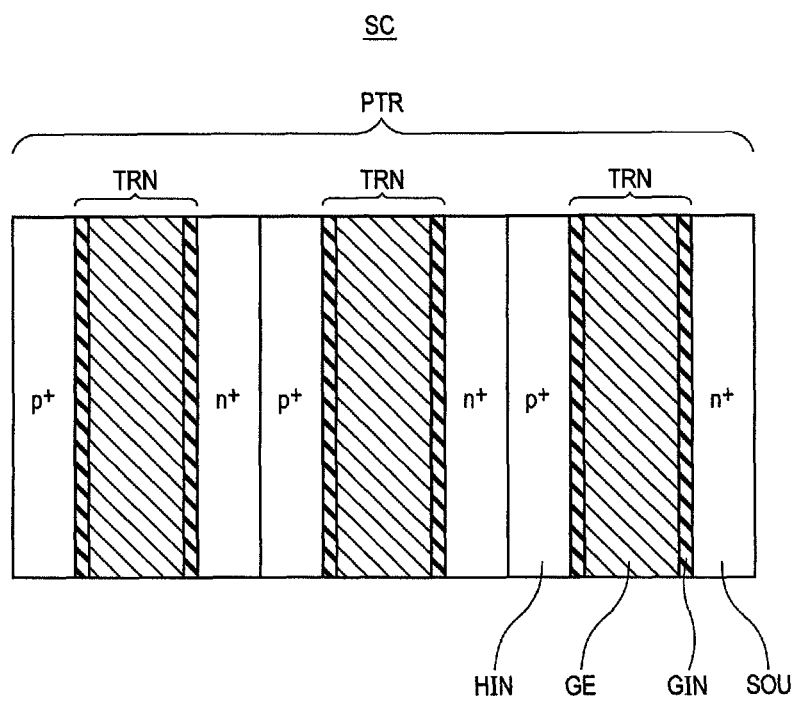
FIG. 2 is a plan view of the semiconductor device.

FIG. 1 is a cross sectional view sowing a configuration of a semiconductor device SC according to a first embodiment. FIG. 2 is a plan view of the semiconductor device SC. The semiconductor device SC has a vertical transistor PTR. The vertical transistor PTR is, for example, a power control transistor. The vertical transistor PTR is formed by using a semiconductor substrate SUB. Specifically, the vertical transistor PTR has a drain layer DRN, a base layer BSE, trenches TRN, a gate insulating film GIN, a gate electrode GE, a source layer SOU, and a second conduction type high concentration layer HIN. The drain layer DRN is of a first conduction type (for example, n-type) and formed in the semiconductor substrate SUB, the base layer BSE is of a second conduction type (for example, p-type), formed in the semiconductor substrate SUB, situated above the drain layer DRN. The trenches TRN are formed in the base layer BSE and extend in parallel to each other to form a stripe pattern. The gate insulating films GIN are formed each on the inner wall of the trenches TRN. The gate electrode GE is buried in each of the trenches TRN. The source layer SOU is formed in the base layer BSE to a depth less than the base layer BSE. The source layer SOU is disposed between each of the multiple trenches TRN. Second conduction type high concentration layer HIN is formed between each of the source layer SOU and the trench TRN in a plan view. The second conduction type high concentration layer HIN is a second conduction type impurity layer which is coupled at the bottom to the base layer BSE and has higher concentration than that of the base layer BSE.

In a plan view, the trench TRN, the source layer SOU, and the second conduction type high concentration layer HIN are arranged in this order repetitively. The trench TRN faces at one lateral side to the source layer SOU and the trench TRN faces at the other lateral side to the second conduction type high concentration layer HIN. Details are to be described assuming the n-type for first conduction type and the p-type for the second conduction type.

The semiconductor substrate SUB comprises a substrate WFR and an epitaxial layer EPI which is epitaxially grown thereover. The substrate WFR is an n$^+$-type substrate and formed, for example, of silicon. In this embodiment, the substrate WFR serves as a drain layer DRN. The epitaxial layer EPI is an n-type epitaxial layer, for example, an n-type silicon layer. A base layer BSE is formed by implanting a p-type impurity into the surface layer of the epitaxial layer EPI. A layer in the epitaxial layer EPI in which the base layer BSE is not formed is an n-type epitaxial layer NEP (first conduction type low concentration layer). The n-type epitaxial layer NEP couples the drain layer DRN and the base layer BSE.

The impurity concentration of the base layer BSE is $5 \times 10^{16}$ atoms/cm$^3$ or more and $5 \times 10^{17}$ atoms/cm$^3$ or less, and the specific resistivity of the n-type epitaxial layer NEP is, for example, 0.4 Ω·cm or more and 1.0 Ω·cm or less. The thickness of the substrate WFR is, for example, 150 nm or more and 300 nm or less and the thickness of the epitaxial layer EPI is, for example, 4.0 µm or more and 15 µm or less.

Trenches TRN are disposed in the epitaxial layer EPI. The trench TRN penetrates the base layer BSE and the lower end of the epitaxial layer EPI intrudes in the n-type epitaxial layer NEP. A gate insulating film GIN is formed on the inner wall and the bottom of the trench TRN. The gate insulating film GIN is formed, for example, by a thermal oxidation method and it may be formed also by a deposition method. The gate insulating film GIN is, for example, a silicon oxide film. Further, a gate electrode GE fills the remaining space of the trench TRN. The gate electrode GE is, for example, a polysilicon film.

The source layer SOU and the second conduction type high concentration layer HIN are disposed each by one between adjacent trenches TRN. Accordingly, only one of two lateral sides of the trench TRN faces the source layer SOU. That is, only the side of the base layer BSE facing one lateral side of the trench TRN serves as a channel of the vertical transistor PTR. The second conduction type high concentration layer HIN is an impurity layer for providing a reference potential to the base layer BSE and formed to a depth more than that of the source layer SOU. The source layer SOU and the second conduction type high concentration HIN situated between two adjacent trenches are in adjacent to each other. The width of the source layer SOU in the direction perpendicular to the trench TRN is preferably, for example, 1.0 µm or less.

The width of the trench TRN is 0.2 µm or more and 0.7 µm or less. The distance between the center of a trench TRN and the center of the trench TRN situated adjacent therewith is, for example, 0.8 µm or more and 4.5 µm or less. The depth of the trench TRN is, for example, 0.6 µm or more and 3.5 µm or less.

A drain electrode EL1 is formed to the surface of the substrate WFR not formed with the epitaxial layer EPI. In interlayer insulating film INS and a source electrode EL2 are formed in this order over the epitaxial layer EPI. The source electrode EL2 is coupled by way of contacts CON buried in the interlayer insulating film INS with the source layer SOU and the second conduction type high concentration layer HIN. The drain electrode EL1 is, for example, a stacked Ti/Ni/Ag film. The source electrode EL2 comprises, for example, Al or an Al alloy. The contact CON comprises, for example, W (tungsten). The contacts CON are disposed, for example, in plurality in the direction where the trenches TRN extend. In a plan view, each of the contacts CON may be arranged so as to overlap the source layer SOU and the second conduction type high concentration layer HIN.

Then, the function and the effect of the first embodiment are to be described with reference to FIG. 3 and FIG. 4.

Figure 3:
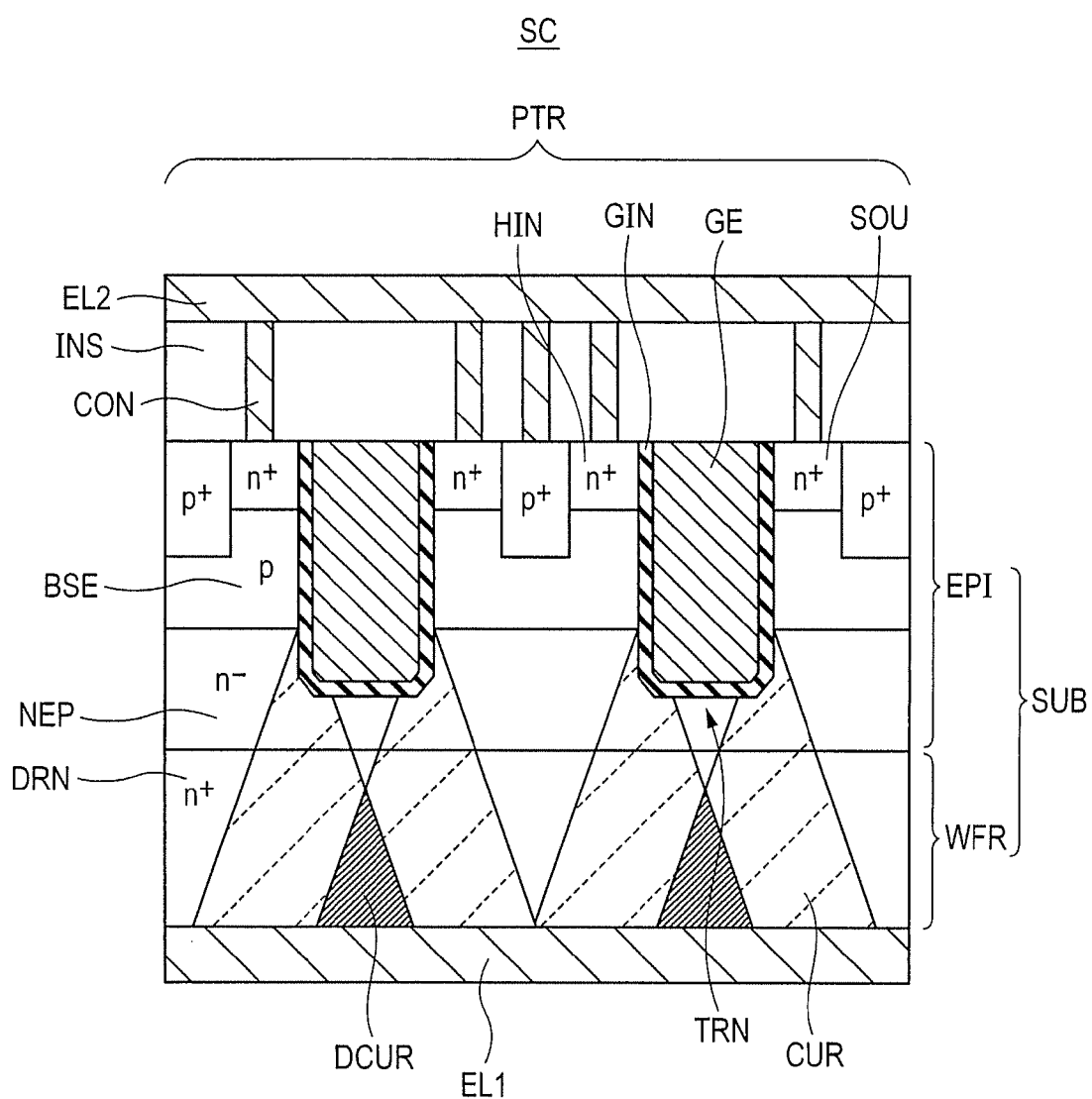
FIG. 3 is a view of showing a path of current flowing from a drain to a source in semiconductor device of a comparative example.

FIG. 3 shows a path of current CUR in a semiconductor device SC of a comparative example when the current CUR flows from the drain to the source. In the vertical transistor shown in the drawing, the source layer SOU is formed so as to face the two lateral sides of the trench TRN respectively. Accordingly, when a voltage higher than a threshold voltage is applied to the gate electrode GE, channels are formed in the portion of the base layer BSE situated on the two lateral sides of the trench TRN respectively. In the vertical transistor, electrons reaching by way of the channel to the n-type epitaxial layer NEP move to the drain electrode EL1, in which the width of the current enlarges as it approaches the drain electrode EL1. Therefore, as the distance between the gate electrodes GE is narrowed, current CUR flowing by way of different channels may sometimes overlap to each other (region shown as a current overlap region DOUR in the drawing). Since the current density increases in the current overlap region DOUR, the on-resistance of the drain increases. Further, the amount of heat generation increases in the current overlap region DCUR to narrow SOA.

Figure 4:
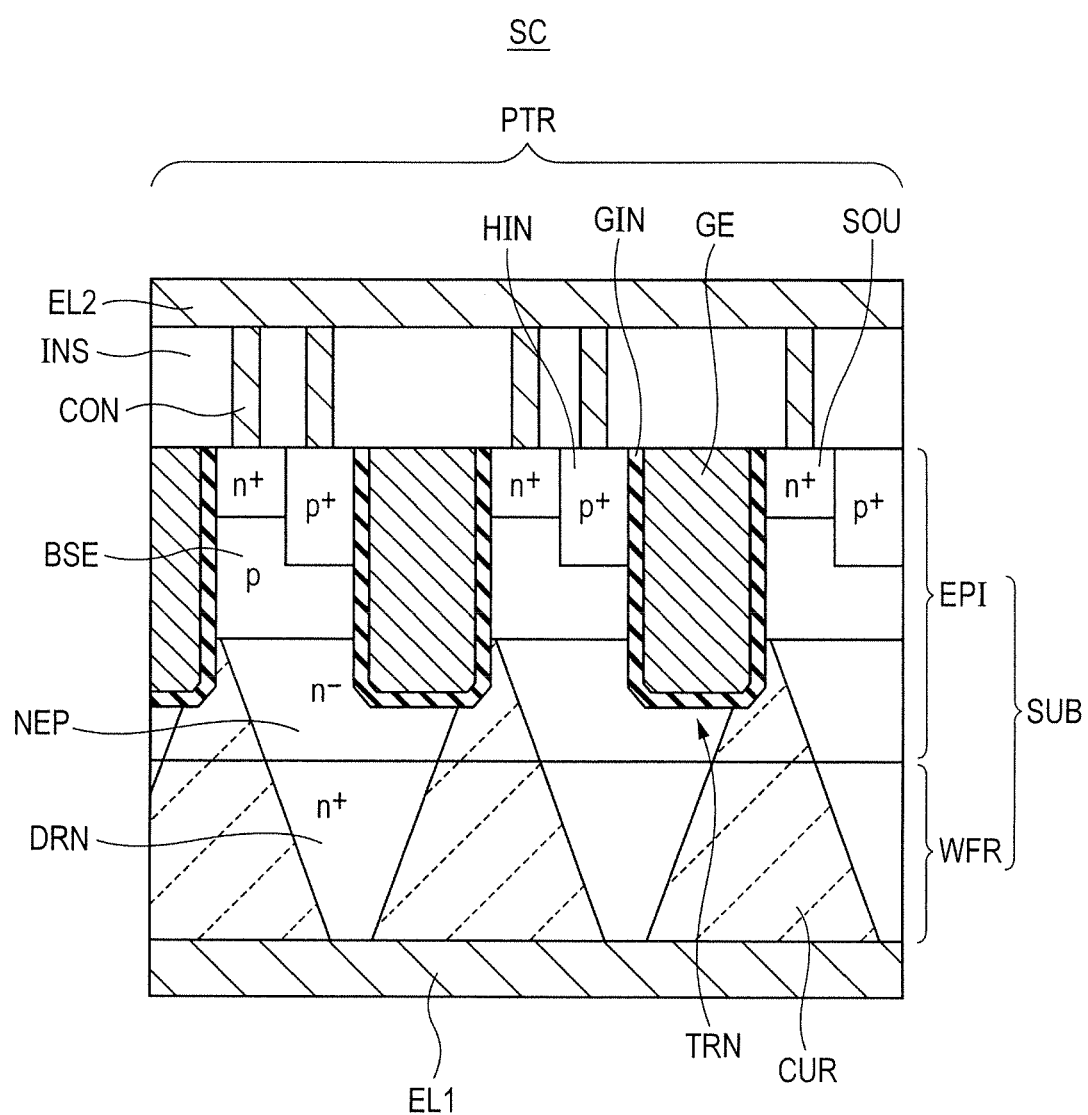
FIG. 4 is a view of a semiconductor device of a preferred embodiment showing a path of a current flow from a drain to a source.

FIG. 4 shows a path of current CUR when the current CUR flows from the drain to the source in the semiconductor device SC shown in FIG. 1 and FIG. 2. In this embodiment, when a voltage higher than a threshold voltage is applied to the gate electrode GE, a channel is formed only in the portion of the base layer BSE situated on one lateral side of the trench TRN. Accordingly, currents CUR flowing by way of different channels are suppressed from overlapping each other. Therefore, increase in the on-resistance of the drain can be suppressed. Further, since generation of the current overlap region DCUR can be suppressed, narrowing of SOA can be suppressed.

Further, when a parasitic bipolar transistor comprising the source layer SOU, the base layer BSE, and the n-type epitaxial layer NEP operates, SOA of the semiconductor device SC is narrowed. When the width of the source layer SOU in the direction perpendicular to the trench TRN is 1.0 μm or less, operation of the parasitic bipolar transistor can be suppressed. Accordingly, narrowing of SOA can be suppressed.

Figure 5:
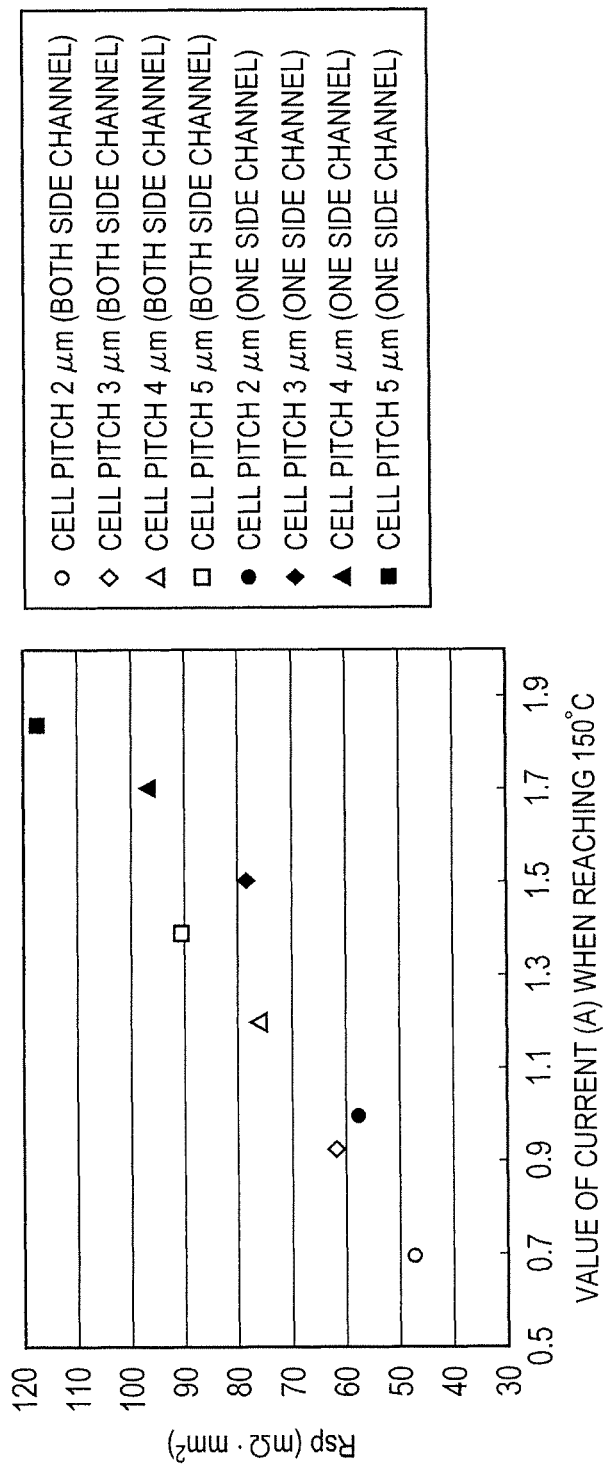
FIG. 5 is a graph showing a relation between the value of a drain current and a specific resistivity (Rsp) when the temperature reaches 150° C. in the vertical transistor of the preferred embodiment and the vertical transistor of the structure shown in FIG. 3.

A graph in FIG. 5 shows a relation between a drain current value and a specific resistivity (Rsp) per unit area when the temperature reaches 150° C. in the vertical transistor PTR according to this embodiment (described as one side channel) and vertical transistor PTR of the structure shown in FIG. 3 (described as both side channel) respectively. It can be seen from the graph that the vertical transistor PTR according to this embodiment generates less amount of heat when an identical current is supplied and also shows low on-resistance of the drain when the identical current is supplied compared with the vertical transistor PTR shown in FIG. 3.

Further, different from Japanese Unexamined Patent Application Publication No. 2000-353805 and Japanese Unexamined Patent Application Publication (Translation of PCT Application) No. 2004-513518, impurity layers other than the second conduction type high concentration layer HIN and the source layer SOU are not formed in the base layer BSE of the vertical transistor PTR. Accordingly, increase in the size of the vertical transistor PTR can be suppressed.

Second Embodiment

Figure 6:
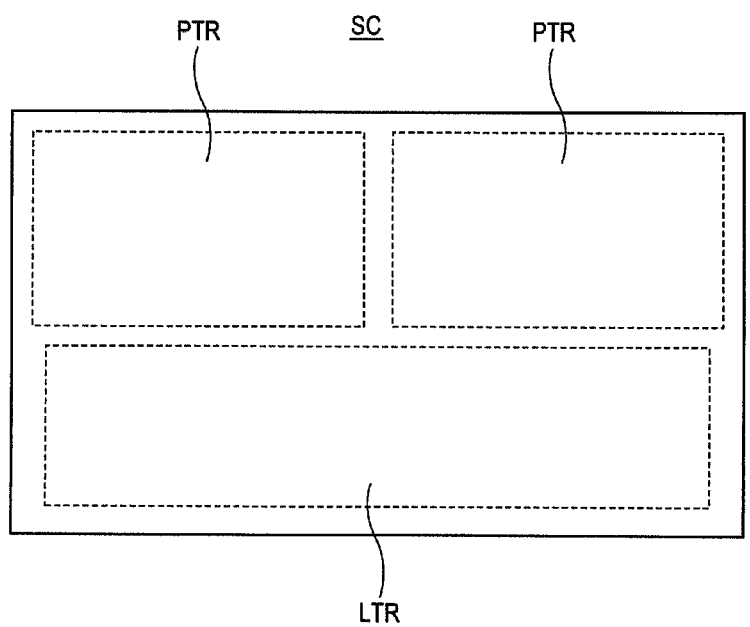
FIG. 6 is a plan view of a semiconductor device according to a second embodiment.

FIG. 6 is a plan view of a semiconductor device SC according to a second embodiment. In the semiconductor device SC, vertical transistors PTR and a logic transistor LTR are formed over an identical substrate and used, for example, as intelligent power device (IPD). The semiconductor device SC may have one vertical transistor PTR or multiple PTRs as shown in the drawing. The logic transistor LTR provides a control circuit for the vertical transistors PTR.

Figure 7:
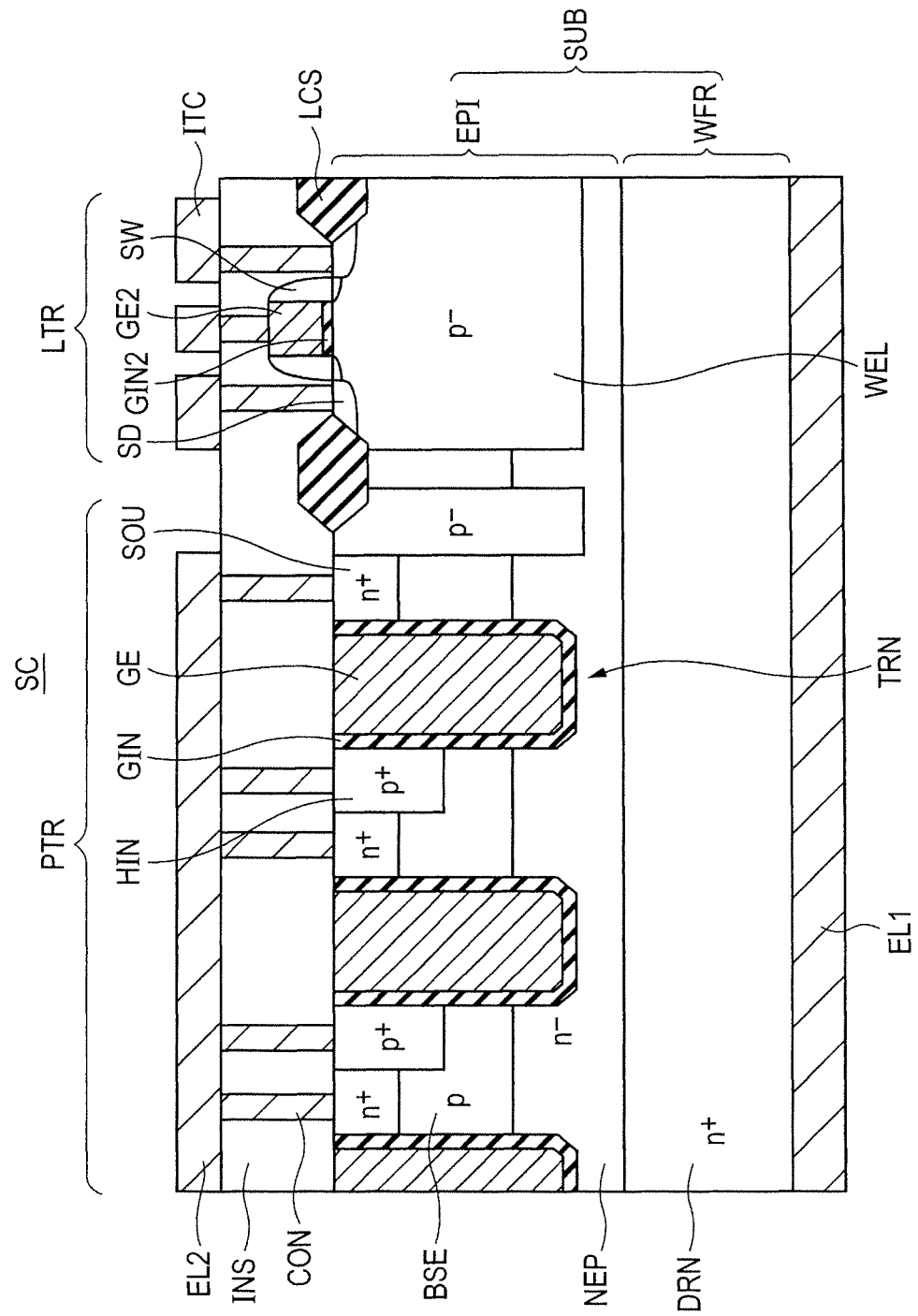
FIG. 7 is a cross sectional view showing a structure of the semiconductor device shown in FIG. 6.

FIG. 7 is a cross sectional view showing a structure of the semiconductor device SC shown in FIG. 6. The vertical transistors PTR and the logic transistor LTR are isolated from each other by a device isolation films LCS. The device isolation film LCS is formed, for example, by a LOCOS oxidation method or may also be formed by an STI method of filling a device isolation film in a trench.

The structure of the vertical transistor PTR is identical with that of the first embodiment. Further, a method of manufacturing the vertical transistor PTR to be described later is identical with the manufacturing method of the first embodiment.

The logic transistor LTR is formed in the epitaxial layer EPI. The logic transistor LTR shown in the drawing is a planar type MIS transistor. The logic transistor LTR may also be a fin type MIS transistor.

More specifically, a p-type well WEL is formed in the epitaxial layer EPI. The well WEL is formed in a region in which the logic transistor LTR is formed and at the periphery of the vertical transistor PTR. A source-drain layer SD of the logic transistor LTR is formed in the portion of the well WEL situated in a region where the logic transistor LTR is formed. The source-drain layer SD has a lightly doped drain (LDD) region.

The logic transistor LTR has, in addition to the source drain layer SD, a gate insulating film GIN2, a gate electrode GE2, and a side wall SW. The gate insulating film GIN2 is formed over the epitaxial layer EPI. The gate electrode GE2 is situated over the gate insulating film GIN2. The side wall SW covers the lateral side of the gate electrode GE2. The logic transistor LTR is not restricted to the illustrated planar type (lateral type) MIS transistor but may be configured also as an LDMIS transistor (Laterally Diffused MIS transistor) structure that moderates an electric field strength between the drain and the gate. Further, a planar type MIS transistor and an LDMIS transistor may be hybridized together over an identical semiconductor substrate SUB.

Multiple interconnects ITC are formed in a layer identical with the source electrode EL2. The interconnects ITC are coupled by way of contacts CON to the source drain layers SD or the gate electrode GE2.

Figure 8:
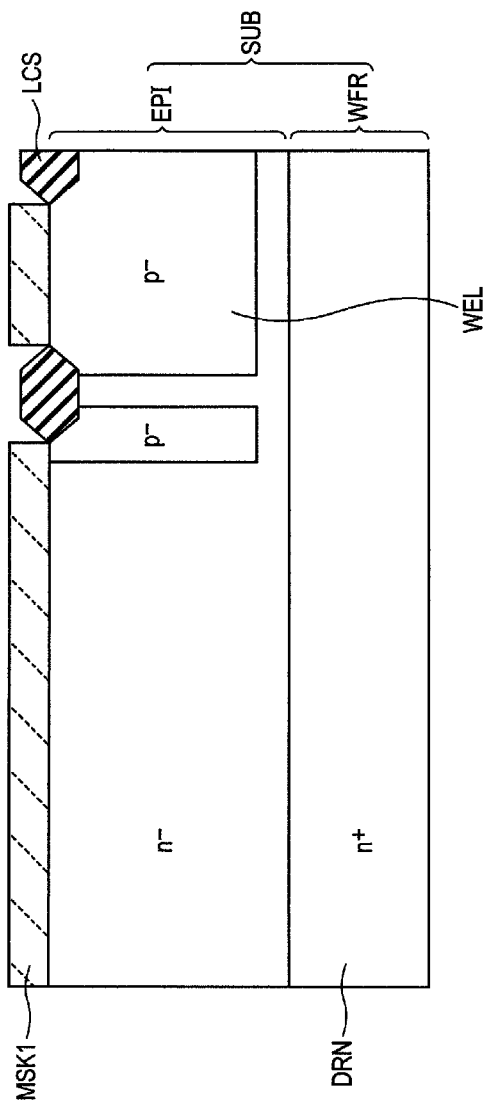
FIG. 8 is a cross sectional view showing a method of manufacturing the semiconductor device shown in FIG. 6 and FIG. 7.

FIG. 8 to FIG. 12 are cross sectional views showing a method of manufacturing the semiconductor device SC shown in FIG. 6 and FIG. 7. At first, as shown in FIG. 8, an epitaxial layer EPI is formed over a substrate WFR. Then, a well WEL is formed by implanting a p-type impurity into the epitaxial layer EPI. Then, a mask film MSK1 is formed over the epitaxial layer EPI. The mask film MSK1 is, for example, a silicon nitride film and has an opening in a region in which a device isolation film LSC is to be formed. Then, the epitaxial layer EPI is thermally oxidized by using the mask film MSK1 as a mask. Thus, a device isolation film LSC is formed.

Figure 9:
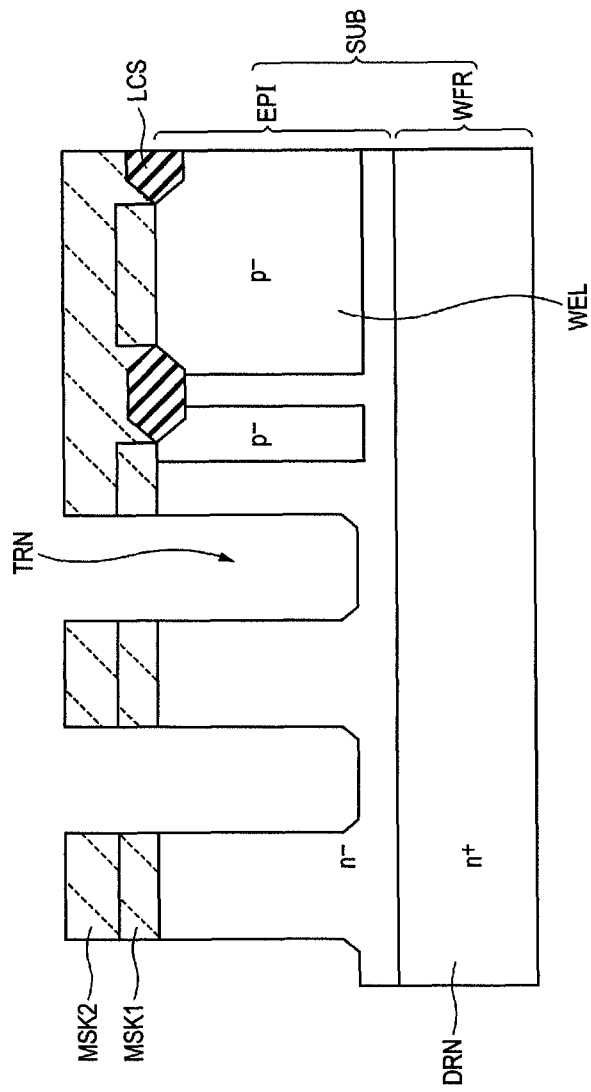
FIG. 9 is a cross sectional view showing the method of manufacturing the semiconductor device shown in FIG. 6 and FIG. 7.

Then, as shown in FIG. 9, a mask film MSK2 is formed over the mask film MSK1 and over the device isolation film LCS. The mask film MSK2 is, for example, a silicon oxide film and has an opening in a region where the trenches TRM are to be formed. Then, the mask MSK1 and the epitaxial layer EPI are etched by using the mask film MSK2 as a mask to form stripe-patterned trenches extending parallel to each other. Thus, multiple trenches TRN are formed in the epitaxial layer EPI.

Figure 10:
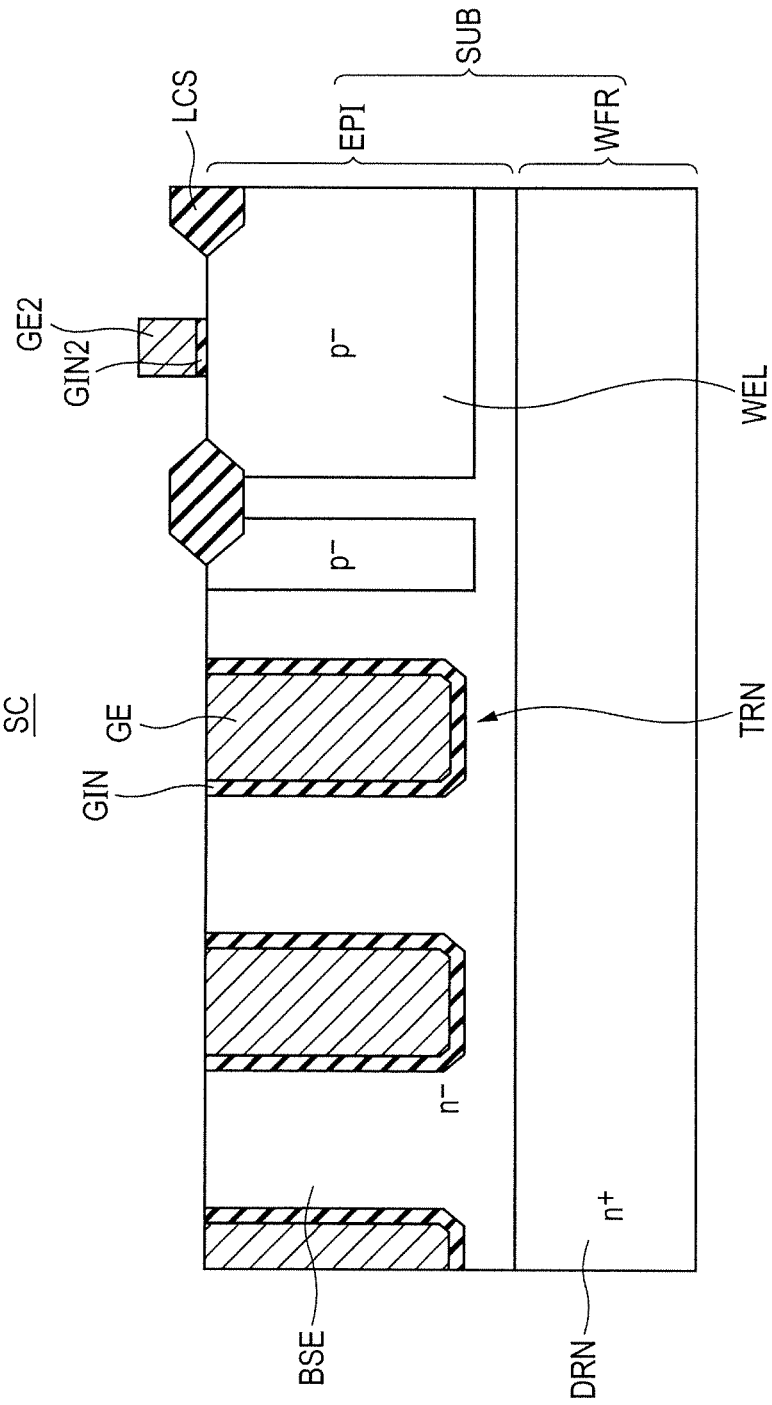
FIG. 10 is a cross sectional view showing the method of manufacturing the semiconductor device shown in FIG. 6 and FIG. 7.

Then, as shown in FIG. 10, the mask film MSK1 and the mask film MSK2 are removed. Then, the surface layer of the epitaxial layer EPI (including the lateral sides and the bottoms of the trenches TRN) is thermally oxidized. Thus, a gate insulating film GIN and a gate insulating film GIN2 are formed. When the thickness of the gate insulating film GIN and that of the gate insulating film GIN2 are different, the gate insulating film GIN and the gate insulating film GIN2 may be formed by thermal oxidation steps different from each other. Further, the steps may also be designed such that the thermal oxidation of forming a thicker film (for example, gate insulating film GIN) is made longer.

Then, an electroconductive film is formed in the trench TRN and over the epitaxial layer EPI. Then, the electroconductive film is removed selectively. Thus, the gate electrode GE and the gate electrode GE2 are formed.

Figure 11:
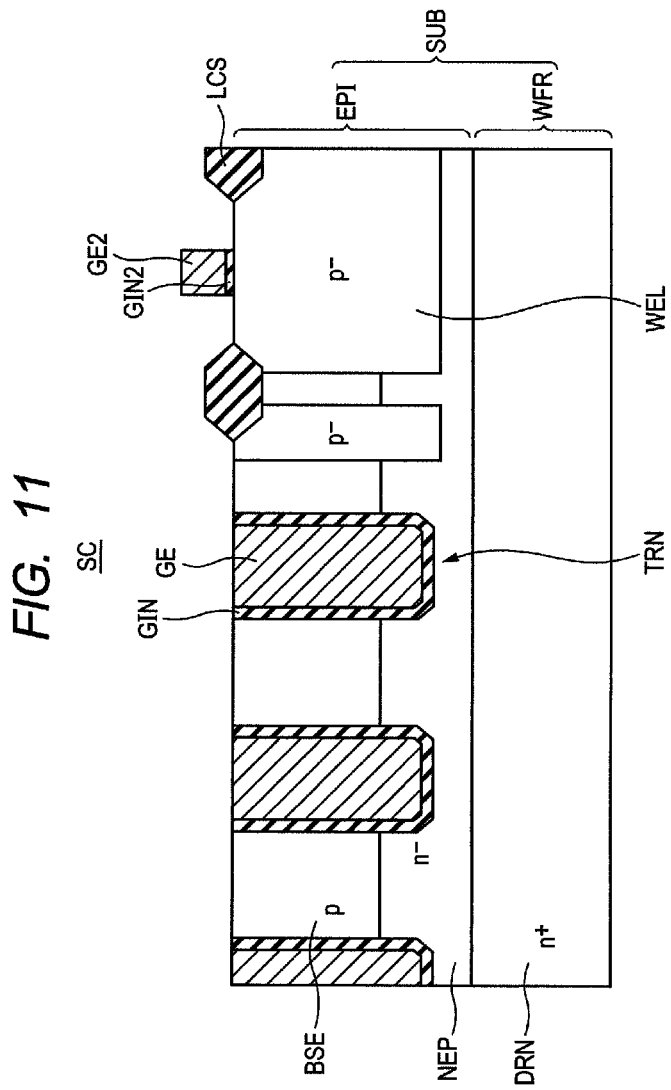
FIG. 11 is a cross sectional view showing the method of manufacturing the semiconductor device shown in FIG. 6 and FIG. 7.

Then, as shown in FIG. 11, a p-type impurity is implanted into the epitaxial layer EPI. Thus, a base layer BSE is formed. A region of the epitaxial layer EPI which is not formed as the base layer BSE remains as an n-type epitaxial layer NEP.

Figure 12:
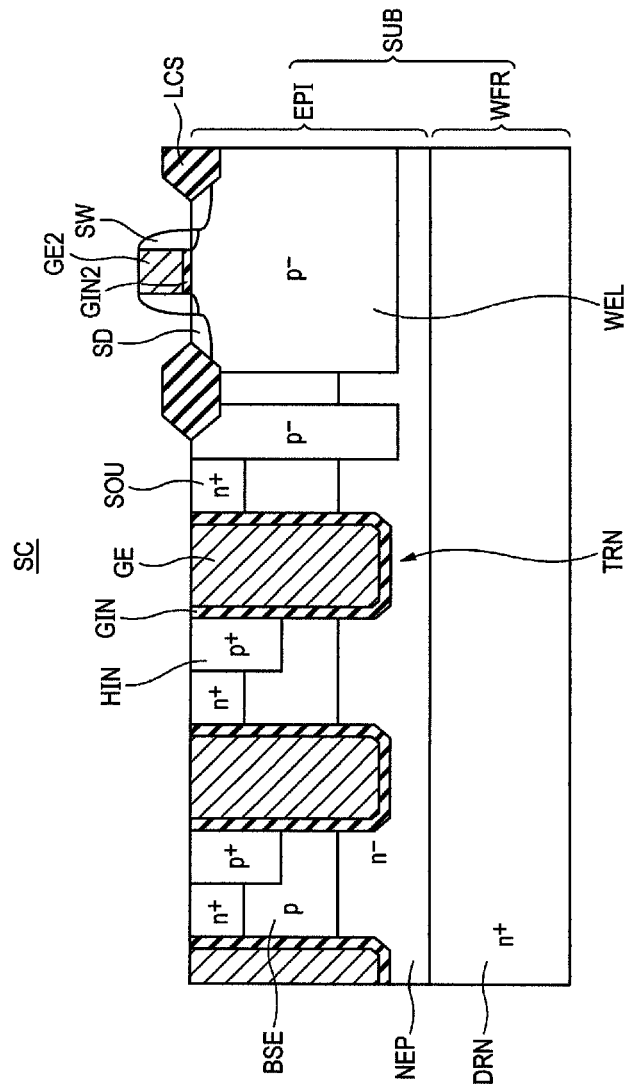
FIG. 12 is a cross sectional view showing the method of manufacturing the semiconductor device shown in FIG. 6 and FIG. 7.

Then, as shown in FIG. 12, an n-type impurity is implanted into the well WEL. Thus, an LDD region of the logic transistor LTR is formed. Then, a side wall SW is formed on the lateral side of the gate electrode GE2. Then, an n-type impurity is implanted into the well WEL and the base layer BSE. Thus, the source drain layer SD and the source layer SOU are formed. Further, a p-type impurity is implanted into the base layer BSE. Thus, a second conduction type high concentration layer HIN is formed.

Subsequently, a drain electrode EL1, an interlayer insulating film INS, contacts CON, and a source electrode EL2 are formed. Thus, the semiconductor device SC shown in FIG. 6 and FIG. 7 is formed.

Also in this embodiment, the same effect as that of the first embodiment can be obtained. Further, the vertical transistors PTR and the control circuit for the vertical transistors PTR can be formed over an identical semiconductor substrate SUB.

Third Embodiment

Figure 13:
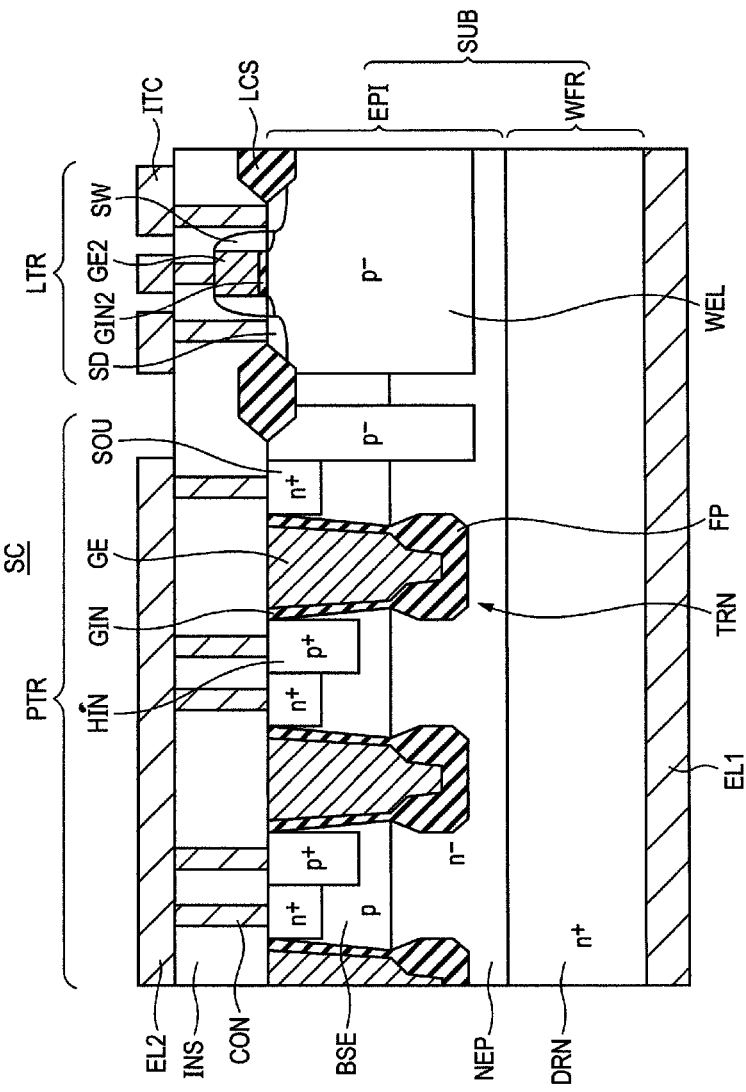
FIG. 13 is a cross sectional view showing the configuration of a semiconductor device according to a third embodiment.

FIG. 13 is a cross sectional view showing a configuration of a semiconductor device SC according to a third embodiment. The semiconductor device SC according to this embodiment has the same configuration as that of the semiconductor device SC according to the first or second embodiment except for having a field plate insulating film FP. The drawing shows a case identical with the second embodiment.

In the field plate insulating film FP, the thickness of the gate insulating film situated in the lower lateral side of the trench TRN is larger than that of the gate insulating film situated in the upper lateral side. The field plate insulating film FP is formed by making the thermal oxidation time longer for the bottom of the trench TRN in the thermal oxidation step for forming the gate insulating film GIN and the gate insulating film GIN2.

Also in this embodiment, the same effect as that of the second embodiment can be obtained. Further, the field plate insulating film FP is formed to the lower lateral wall of the trench TRN. The thickness of the field plate insulating film FP is larger than that of the gate insulating film GIN. Accordingly, lowering of the drain withstand voltage of the vertical transistor PTR caused by concentration of electric fields to the lower portion of the trench TRN can be suppressed. Further, a parasitic capacitance formed between adjacent gate electrodes GE is also lowered.

Fourth Embodiment

Figure 14:
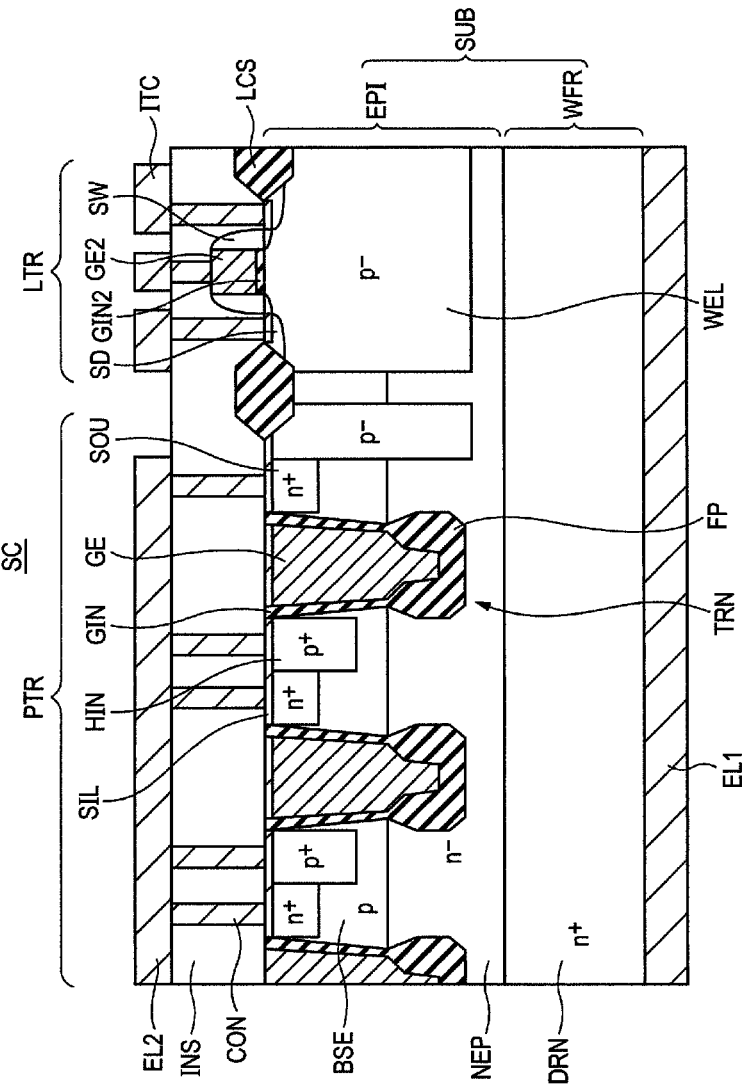
FIG. 14 is a cross sectional view showing the configuration of a semiconductor device according to a fourth embodiment.

FIG. 14 is a cross sectional view showing a configuration of a semiconductor device SC according to a fourth embodiment. A semiconductor device SC according to this embodiment has the configuration identical with that of the semiconductor device SC according to the third embodiment except for having a silicide layer SIL.

The silicide layer SIL is formed continuously over the source layer SOU and over the second conduction type high concentration HIN. The silicide layer SIL is formed also over the gate electrode GE, over the source-drain layer GE2, and over the gate electrode GD.

The method of manufacturing the semiconductor device SC according to this embodiment is identical with the method of manufacturing the semiconductor device SC according to the third embodiment except for having a step of forming the silicide layer SIL after forming the source-drain layer SD, the source layer SOU, and the second conduction type high concentration layer HIN and before forming the interlayer insulating film INS. The silicide layer SIL is formed by forming a metal layer that serves as the silicide layer SIL (for example, Ti, Ni, or Co) over the epitaxial layer EPI and over the gate electrode GE2, and then applying a heat treatment. A remaining portion of metal not forming the silicide layer SIL is removed by etching.

Also in this embodiment, the same effect as that of the third embodiment can be obtained. Further, the source layer SOU and the second conduction type high concentration layer HIN are coupled by the silicide layer SIL. Accordingly, generation of difference in the potential between the source layer SOU and the second conduction type high concentration layer HIN, that is, generation of the potential between the source layer SOU and the base layer BSE can be suppressed. Accordingly, operation of a parasitic bipolar transistor comprising the source layer SOU, the base layer BSE, and the n-type epitaxial layer NEP can be suppressed. As a result, narrowing of SOA of the semiconductor device SC can be suppressed.

Fifth Embodiment

Figure 15:
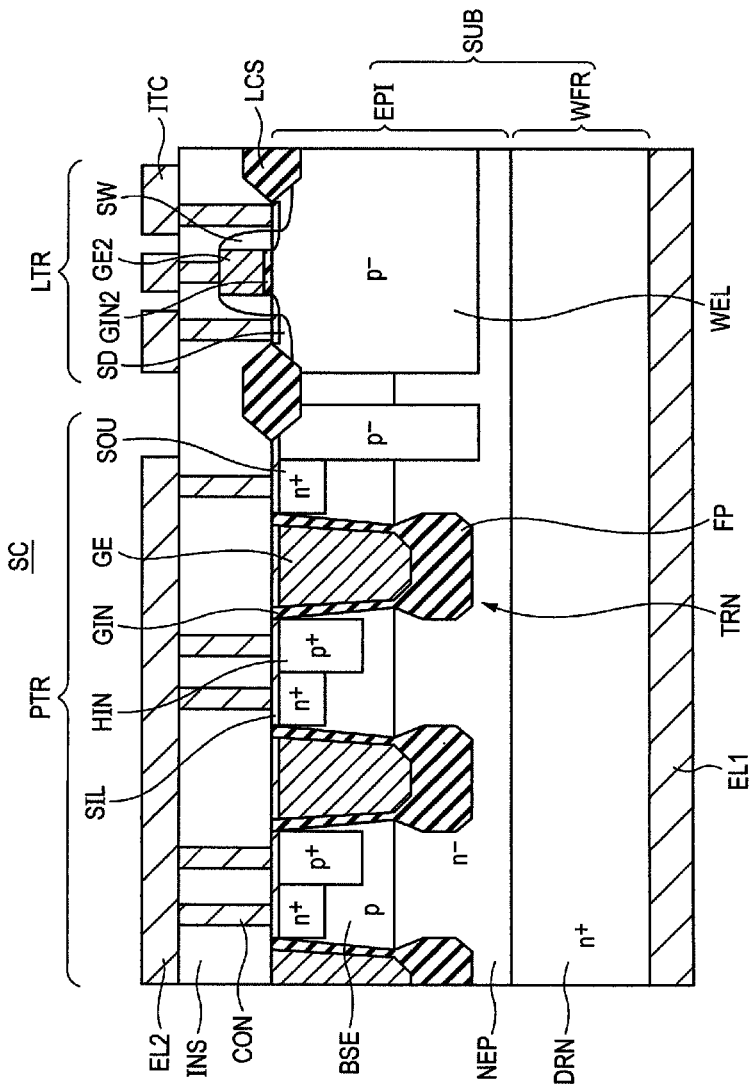
FIG. 15 is a cross sectional view showing the configuration of a semiconductor device according to a fifth embodiment.

FIG. 15 is a cross sectional view showing a structure of a semiconductor device SC according to a fifth embodiment. The semiconductor device SC according to this embodiment has a configuration identical with that of the semiconductor device SC according to the fourth embodiment excepting that the bottom of the trench TRN is filled with a field plate insulating film FP. Such a structure can be achieved by narrowing the width of the trench TRN, for example, to 0.3 μm or less.

Also in this embodiment, the same effect as that of the fourth embodiment can be obtained. Further, since the gate electrode GE is not situated at the bottom of the trench TRN, a parasitic capacitance generated between adjacent gate electrodes GE can be lowered further.

Sixth Embodiment

Figure 16:
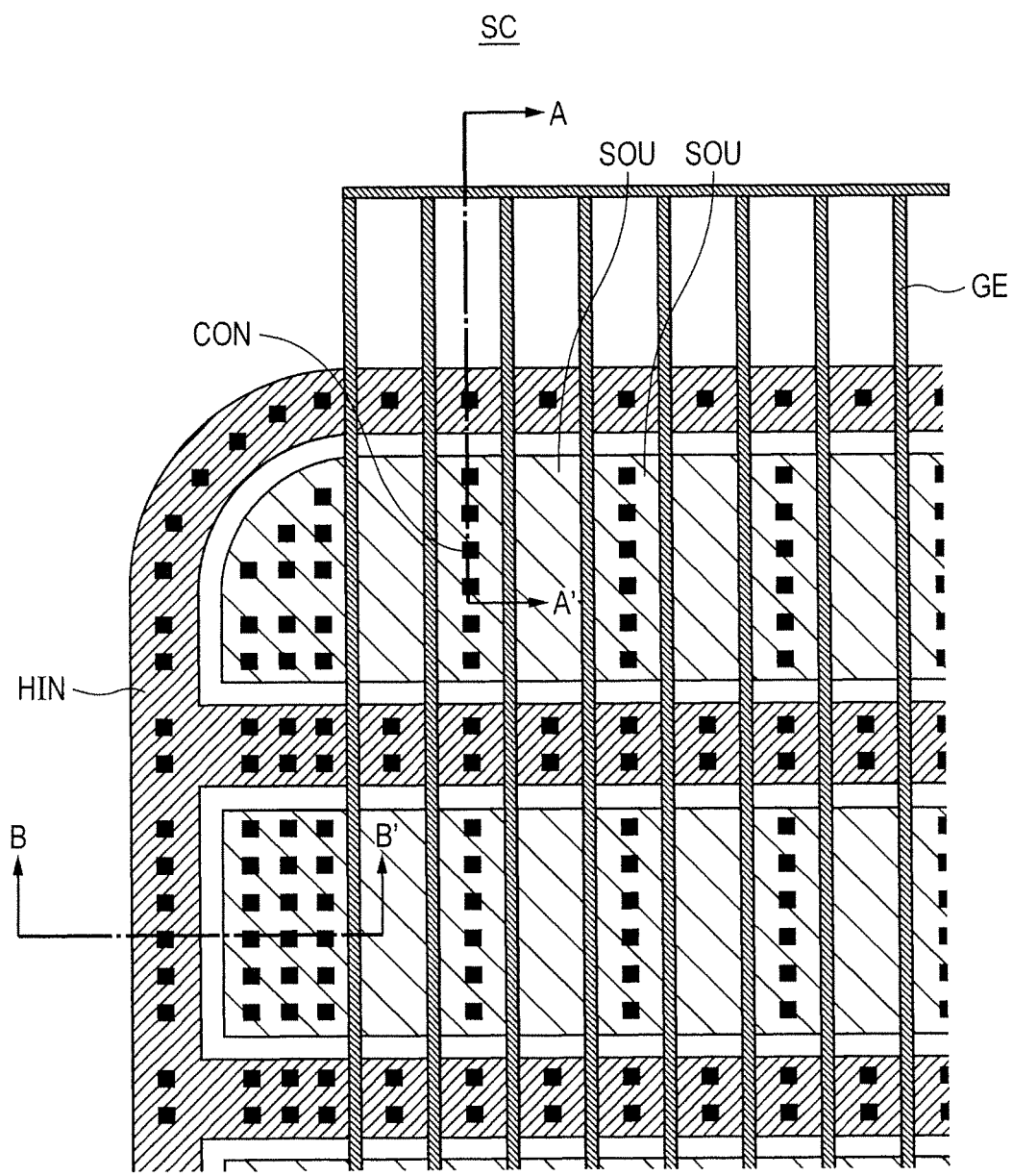
FIG. 16 is a cross sectional view showing the configuration of a semiconductor device according to a sixth embodiment.
Figure 17A:
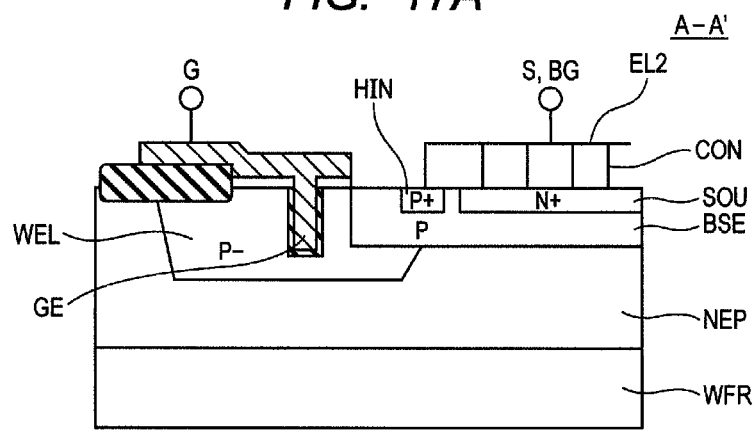
FIG. 17A is a cross sectional view along line A-A' in FIG. 16.
Figure 17B:
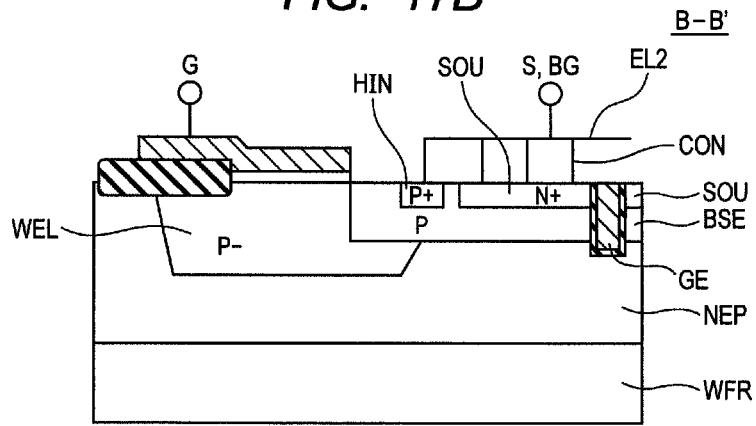
FIG. 17B is a cross sectional view along line B-B' in FIG. 16.

A peripheral portion of a vertical transistor PTR forming region is to be described. FIG. 16 is a plan view showing a structure of a semiconductor device SC according to a sixth embodiment. FIG. 17A is a cross sectional view along line A-A' in FIG. 16 and FIG. 17B is a cross sectional view along line B-B' in FIG. 16. The semiconductor device SC according to this embodiment has a configuration identical with one of the first to fifth embodiments except for the followings.

At first, the source layers SOU and the second conduction type high concentration layers HIN are arranged alternately in the direction where the trench TRN and the gate electrode GE extend. The width of the source layer SOU is larger than the width of the second conduction type high concentration layer HIN in the direction where the trench TRN and the gate electrode GE extend.

Then, in a certain portion (for example, along cross section shown B-B in FIG. 17B), both of lateral sides of the trench TRN face the source layers SOU. The source layer SOU is divided into multiple regions by the trenches TRN and the gate electrodes GE. Contacts CON for coupling the source layer SOU and the source electrode EL2 are disposed on every other of the divided source layers SOU when viewed in the direction perpendicular to the trench TRN and the gate electrode GE. That is, the source layer SOU facing the one lateral side is coupled by way of the contact CON to the source electrode EL2 but the source layer SOU facing the other lateral side is not coupled to the source electrode EL2 but is in a floating state. Also in such a structure, the channel is formed only to the portion of the base layer BSE situated on the one lateral side of the trench TRN.

The well WEL is formed also to a position surrounding the periphery of the base layer BSE. The trench TRN and the gate electrode GE are formed in the well WEL. The gate electrode GE in the well WEL is used as a portion of a gate interconnect.

That is, the gate electrode GE of the vertical transistor PTR is applied with a potential by way of the gate electrode GE in the well WEL.

Also in this embodiment, the same effect as that of the first to fifth embodiments can be obtained.

Seventh Embodiment

Figure 18:
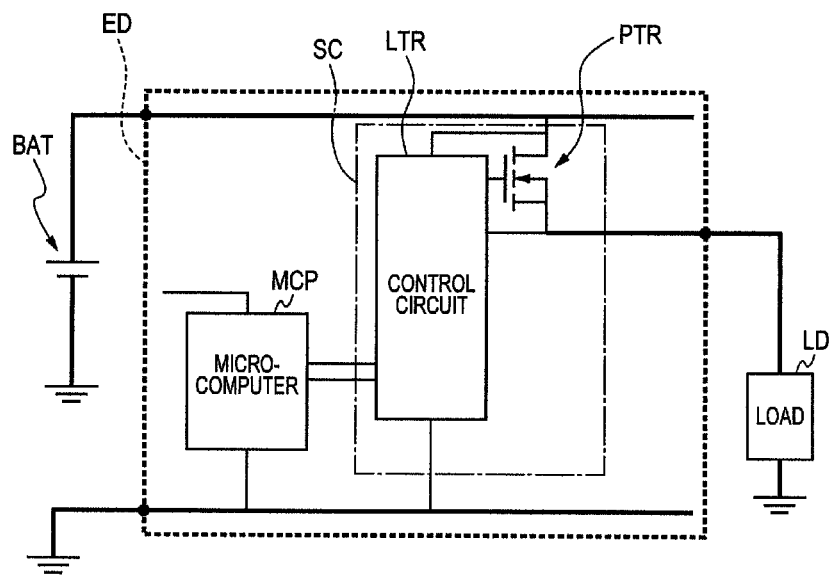
FIG. 18 is a view showing a circuit configuration of an electronic device according to a seventh embodiment.
Figure 19:
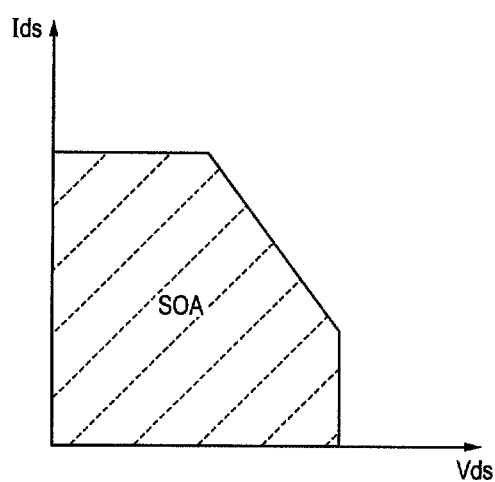
FIG. 19 is a view for explaining SOA.

FIG. 18 is a view showing a configuration of a circuit of an electronic device according to a seventh embodiment. The electronic device is used, for example, for vehicles such as automobiles and has an electronic device ED, a power source BAT, and a load LD. The power source BAT is, for example, a battery mounted on a vehicle. The load LD is an electronic part, for example, an electronic part mounted on the vehicle, such as a head lump. The electronic device ED controls power supplied from the electric source BAT to the load LD.

The electronic device ED comprises a semiconductor device SC and a semiconductor device MCP mounted over a circuit substrate (for example, printed wiring board). The semiconductor device SC has a structure shown in one of the first to sixth embodiments. The semiconductor device MCP is a microcomputer which is connected by way of interconnects of the circuit substrate to the logic transistor LPR of the semiconductor device SC. The semiconductor device MCP controls the semiconductor device SC. Specifically, the semiconductor device MCP inputs a control signal to the logic transistor LTR. The logic transistor LTR inputs a signal to the gate electrode GE of the vertical transistor PTR in accordance with the control signal inputted from the semiconductor device MCP. By the control of the vertical transistor PTR, power from the electric source BAT is supplied appropriately to the load LD. This embodiment can improve SOA of the semiconductor device SC and can improve the device characteristics of the electronic device ED having the semiconductor device SC. Further, the embodiment can improve the characteristics of the electronic system using the semiconductor device SC.

The invention made by the present inventors has been described specifically based on the preferred embodiments but it will be apparent that the invention is not restricted to the embodiments but can be modified variously within a range not departing the gist of the invention.

What is claimed is:

1. A semiconductor device comprising:
    a semiconductor substrate;
    a first conduction type drain layer formed in the semiconductor substrate and situated at a lower face of the semiconductor device;
    a second conduction type base layer formed in the semiconductor substrate and situated above the drain layer;
    a plurality of trenches formed in the base layer;
    a gate insulating film formed on an inner wall of each of the trenches;
    a gate electrode buried in each of the trenches;
    a first conduction type source layer formed in the base layer to a depth less than a lower surface of the base layer and situated between each of the trenches;
    a second conduction type high concentration layer formed in the base layer to a depth less than a lower surface of the base layer and greater than the depth of the source layer between the source layer and the trench, coupled to the base layer, and having a higher concentration of dopant than that of the base layer,
    an interlayer insulating film overlying the base layer and the plurality of trenches;
    a source electrode overlying the interlayer insulating film; and
    a plurality of contacts buried in the interlayer insulating film coupling the source electrode with the source layer and the second conduction type high concentration layer,
    wherein the trench, the source layer, and the second conduction type high concentration layer are arranged in this order repetitively in plan view, and one lateral side of the trench faces the source layer and another lateral side of the trench faces the second conduction type high concentration layer, and
    the base layer is located between immediately adjacent trenches, is L-shaped, and directly contacts sidewalls of the immediately adjacent trenches.

2. A semiconductor device according to claim 1, wherein a distance between centers of adjacent trenches is 0.8 μm or more and 4.5 μm or less.

3. A semiconductor device according to claim 1, comprising:
    a first conduction type low concentration layer situated between the base layer and the drain layer, having an impurity concentration lower than that of the drain layer,
    wherein the impurity concentration in the base layer is $5 \times 10^{16}$ atoms/cm$^3$ or more and $5 \times 10^{17}$ atoms/cm$^3$ or less, and
    wherein a specific resistivity of the first conduction type low concentration layer is 0.4 Ω·cm or more and 1.0 Ω·cm or less.

4. A semiconductor device according to claim 1, wherein a width of the trench is 0.2 μm or more and 0.7 μm or less.

5. A semiconductor device according to claim 1, wherein a thickness of the gate insulating film situated on a lower lateral side of the trench is larger than that of the gate insulating film situated on an upper lateral side of the trench.

* * * * *